United States Patent
Shectman

(10) Patent No.: US 6,252,790 B1
(45) Date of Patent: Jun. 26, 2001

(54) LARGE-CAPACITY CONTENT ADDRESSABLE MEMORY WITH SORTED INSERTION

(76) Inventor: Nicholas Shectman, 75 Lexington Ave., Somerville, MA (US) 02144

( * ) Notice: Subject to any disclaimer, the term of this patent is extended or adjusted under 35 U.S.C. 154(b) by 0 days.

(21) Appl. No.: 09/688,453

(22) Filed: Oct. 16, 2000

(51) Int. Cl.[7] .................................................. G11C 15/00
(52) U.S. Cl. .................. 365/49; 365/189.07; 365/230.03
(58) Field of Search ................................. 365/49, 189.07, 365/230.03

(56) References Cited

U.S. PATENT DOCUMENTS

| | | | |
|---|---|---|---|
| 4,627,024 | * 12/1986 | Whalen et al. | 364/900 |
| 4,794,559 | * 12/1988 | Greenberger | 365/49 |
| 5,319,589 | * 6/1994 | Yamagata et al. | 365/49 |
| 5,388,066 | * 2/1995 | Hamamoto et al. | 365/49 |
| 5,438,535 | * 8/1995 | Lattibeaudiere | 365/230.08 |
| 5,870,324 | * 2/1999 | Helwig et al. | 365/49 |
| 6,061,262 | * 5/2000 | Schultz et al. | 365/49 |
| 6,081,441 | * 6/2000 | Ikeda | 365/49 |
| 6,169,685 | * 1/2001 | Gandini et al. | 365/49 |

* cited by examiner

Primary Examiner—Vu A. Le
Assistant Examiner—Tuan T. Nguyen

(57) ABSTRACT

A large-capacity content addressable memory (CAM) is disclosed. A first array of RAM cells are used to store the data in a sorted fashion. The comparison function is performed by reading a subset of the first RAM cells into a set of comparator devices adjacent to the first array. Each comparator is connected to a plurality of RAM cells, each cell in a different subset of the array. A second array of RAM cells are used to store information about the order of the stored data. The second RAM cells are compared to the comparand using a window comparator to determine which subset of the first RAM cells to examine. A write management device maintains the data ordering in the first RAM array and the additional information in the second RAM array when data is loaded into the CAM.

15 Claims, 2 Drawing Sheets

LARGE-CAPACITY CONTENT ADDRESSABLE MEMORY WITH SORTED INSERTION

BACKGROUND OF THE INVENTION

The present invention relates to a content addressable memory.

The present invention improves upon the following prior art:

1. U.S. Pat. No. 3,648,254 granted to W. F. Beausoleil on Mar. 7, 1972 discloses a content addressable memory (CAM) using less than one comparator per cell (shared comparators).
2. U.S. Pat. No. 4,145,737 granted to S. M. Lamb et al. on Mar. 20, 1979 discloses a CAM using shared comparators, wherein only a portion of the CAM storage is used for any given access.
3. U.S. Pat. No. 4,357,686 granted to J. H. Scheuneman on Nov. 2, 1982 discloses a dynamic memory (DRAM) with automatic refresh.
4. U.S. Pat. No. 4,622,653 granted to D. J. McElroy on Nov. 11, 1986 discloses a CAM using shared comparators with DRAM, wherein each row of the DRAM is read in turn during a search to find possible matches.
5. U.S. Pat. No. 4,627,024 granted to B. H. Whalen et al. on Dec. 2, 1986 discloses a content window addressable memory utilizing magnitude comparators rather than equality comparators.
6. U.S. Pat. No. 4,794,559 granted to A. J. Greenberger on Dec. 27, 1988 discloses a ternary CAM using shared comparators with DRAM.
7. U.S. Pat. No. 4,845,668 granted to J. Sano et al. on Jul. 4, 1989 discloses a variable-length content CAM.
8. U.S. Pat. No. 4,914,630 granted to K. Fujishima et al. on Apr. 3, 1990 discloses a DRAM with automatic refresh, wherein the memory is divided into banks and the inactive bank is refreshed.
9. U.S. Pat. No. 5,561,429 granted to M. Halberstam et al. on Oct. 1, 1996 discloses a content window addressable memory utilizing magnitude comparators rather than equality comparators, wherein the input and comparison words are split bit-wise into slices of more than one bit each and the comparators used for comparisons involving more than one slice.
10. U.S. Pat. No. 5,875,143 granted to J. Ben-Zvi on Feb. 23, 1999 discloses a DRAM with selective automatic refresh, wherein unused rows of the DRAM are not refreshed.
11. U.S. Pat. No. 6,061,262 granted to K. J. Schultz et al. on May 9, 2000 discloses a CAM using shared comparators, wherein the memory is segmented into a small number of blocks, and each block is read in turn during a search to find possible matches, using an internal clocking scheme.

The existing art, taken together, is capable of simultaneously achieving one or two of the goals of high speed, low power consumption, low cost and large capacity. It is the object of the invention to provide a content addressable memory architecture which can simultaneously reduce the cost and power consumption and increase the speed and capacity of content addressable memory beyond that which is currently available.

BRIEF SUMMARY OF THE INVENTION

An improvement on the prior art is achieved through a novel design which is capable of simultaneously supporting both of the following:

1. Reduced transistor count and higher capacity through use of dynamic memory cells without restriction as to cell array geometry; reduced numbers of comparators; and simple control mechanisms; and
2. Reduced power consumption and higher speed through examination and comparison of only a subset of content values to the comparand.

This design accomplishes these goals through the arrangement and indexing of data in the main content addressable memory to allow only a portion of the main memory to be examined for any given search. The additional circuitry required may be integrated into the control circuitry of the main memory.

This invention does not interfere with the adoption of a standard interface to the content addressable memory like those used in existing commercial non-dynamic content addressable memories.

DETAILED DESCRIPTION OF THE INVENTION

Figure 1:
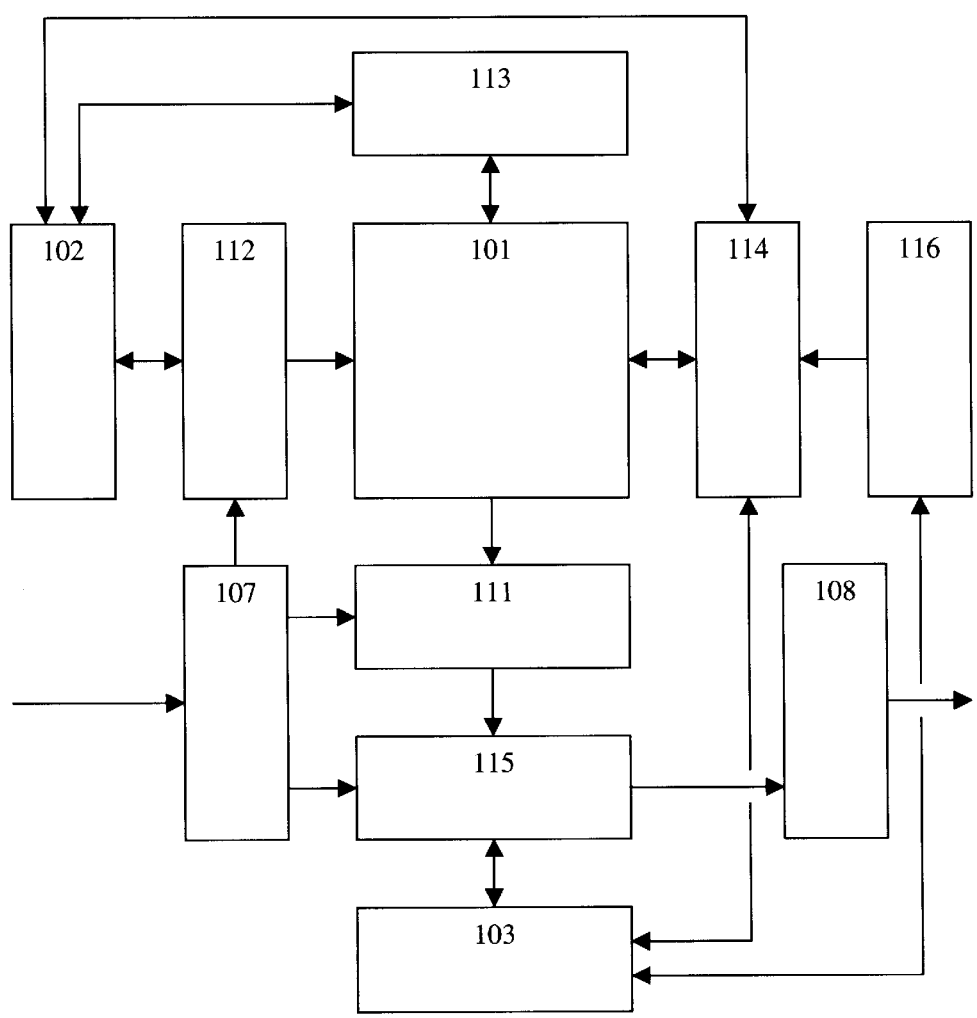
FIG. 1 shows a block diagram of an example content-addressable device conforming to a specific embodiment of the invention.

FIG. 1 shows a block diagram of an example CAM conforming to a specific embodiment of the invention. In FIG. 1, the CAM consists of:

1. a first memory 101 which is a dynamic memory, and which is used to store content data;
2. a second memory 102, which is used to store information about the arrangement of the content data in the first memory 101;
3. a third memory 103, which is used to store portions of the content data from the first memory 101;
4. an input interface 107;
5. an output interface 108;
6. a first logic device 111 which receives data from the first memory 101 and the input interface 107 and which compares the data from the first memory 101 and the input interface 107 to determine a match which may be a longest match;
7. a second logic device 112 which receives data from the input interface 107, reads data from the second memory 102, compares the data from the input interface 107 to the data in the second memory 102, and, based on this comparison, controls access to the first memory 101 by causing a portion of the first memory 101 to be read out to the first logic device 111;
8. a third logic device 113 which refreshes the first memory 101 and which may read data from the second memory 102 to determine whether portions of the first memory 101 need to be refreshed;
9. a fourth logic device 114 which updates the first memory 101, second memory 102, and third memory 103;
10. a fifth logic device 115 which receives data from the input interface 107 and first logic device 111, reads the third memory 103 and sends data to the output interface 108; and
11. a sixth logic device 116 which monitors the amount of data stored in the third memory 103 and inhibits the action of the fourth logic device 104.

Figure 2:
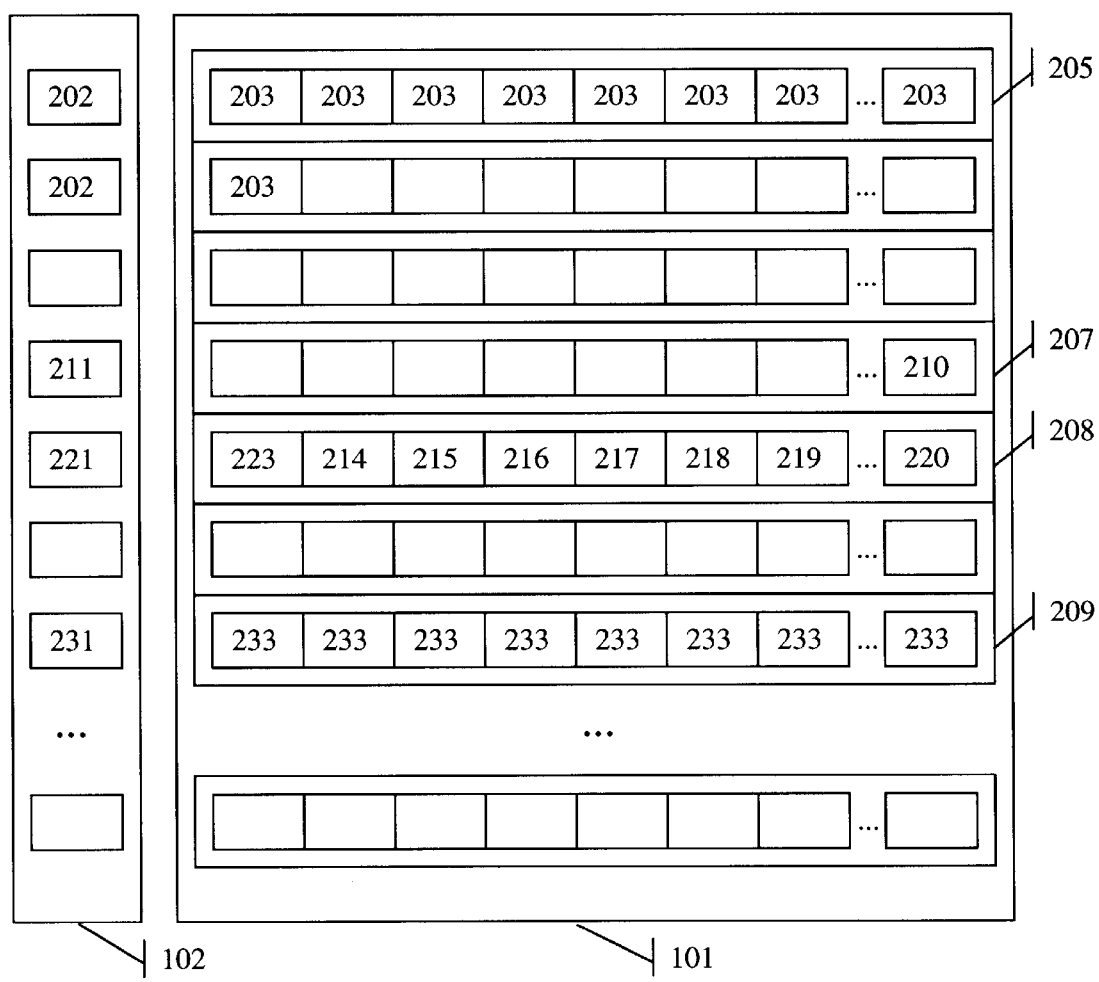
FIG. 2 shows the organization and content of the second and first memory arrays, with data arranged in the arrays in accordance with the invention.

FIG. 2 shows the organization and content of the second and first memory arrays, with data arranged in the arrays in accordance with the invention. In FIG. 2, the memory arrays 101 and 102 are the memory arrays 101 and 102 from FIG. 1. Memory array 101 is arranged as a two-dimensional array of rows 205 and columns. The rows correspond to portions or blocks of memory to be read into the first logic device 111 (shown in FIG. 1). Each row 205 in memory array 101 contains a plurality of content words 203, each of which consists of a match portion and a result portion. Memory array 102 is arranged as a one-dimensional array of partial match values 202. The partial match values 202 are no longer than the match portions of the content words 203. If the partial match values 202 are shorter than the match portions of the content words 203, they may be extended to the length of the match portions of the content words 203.

Each partial match value 202 in memory 102 corresponds to a row 205 in memory 101. For instance, value 211 corresponds to row 207 value 221 to row 208 and value 231 to row 209. Each partial match value 202 holds a value that, when extended, is greater than the match portions of all the content words 203 in the corresponding row 205 but less than the match portions of all the content words 203 in the next row. For instance, value 211, when extended, is greater than the match portions of all the content words 203 in row 207 but less than the match portions of all the content words 203 in row 208.

If all of the content values 203 in a row 205 are empty, this may be indicated by storing a special value in the corresponding partial match value 202. For example, if all of the content values 233 in row 209 are empty, this could for example be indicated by storing the value "0" in partial match value 231.

If the partial match values 202 are shorter than the match portions of the content words 203, there must be at least as many columns in memory array 101 as there are possible matches to the partial match values 202. For instance, if the partial match values 202 are six bits long and the match portions of the content words 203 are eight bits long, then there must be at least four columns in memory array 101.

If the comparators in logic device 111 perform a longest match rather than an exact match, it may be necessary to duplicate certain values so they can be present in more than one row. This requires that there be at least as many columns in memory array 101 as there are bits the partial match values 202, in addition to any requirements due to the difference in word length between the partial match values 202 and the match portions of the content words 203.

As an example, an embodiment of the CAM contains content words 203 with 8-bit match portions with the hexadecimal values "80", "81", "82", "83", "84", "85", "86", "87", "89", "8A", "8B", "8D", "8E", "8F". Note that there is no content word 203 with a match portion equal to "88" or "8C". The comparators in logic device 111 are constructed so that a comparand will match the content word 203 with the longest match so long as no bits are set in the content word 203 which are not set in the comparand. Thus the comparand "8C" will match "8C", "88", or "80", in decreasing order of precedence. The CAM in this example has 8 columns per row. If a row 205 contains a content word 203 with a match portion equal to "89", and the comparand is "88", the second logic device will select that row 205 because "88" is greater than the maximum value 202 of the values in the previous row 205. In order to correctly return the result portion of the content word 203, the content word 203 with match portion equal to "80" must also be stored in that row 205. Likewise, the row 205 containing the content word 203 with match value 8D must also contain the content word 203 with match value "80". However, all the content words 203 between "80" and "8D" will not fit in the row 205, so the content word 203 with match value "80" must be duplicated.

In this example, the match values of the content words 203 and partial match words 202 take the following values: "82" in word 210 and word 211; "83" in word 213; "84" in word 214, "85" in word 215, "86" in word 216, "87" in word 217, "89" in word 218, "8A" in word 219 and word 221, and "80" in word 220.

When data is read from the CAM, the following operations occur:
1. The comparand is received by the input interface 107 and sent to the logic devices 111, 112, and 115.
2. Logic device 112 compares the comparand to each of the ranges delineated by the values 202 stored in memory 102 and selects a row 205 of memory 101 to be read into logic device 111. Although the comparand may not exactly match the match portion of a content word 203 in the row 205, the row 205 contains all the content words 203 whose match portions may form a partial match, so only one row 205 need be examined.
3. Logic device 111 compares the comparand to the match values of each content word 203 in the selected row 205. If the comparand matches the match portion of more than one content word 203, the longest match is selected. Logic device 111 sends the match and result information to logic device 115.
4. Logic device 115 compares the comparand to the match values of each content word in the memory 103. If the comparand matches the match portion of more than one content word, the longest match is selected. The resulting match is compared to the match information from logic device 111. Logic device 115 sends the result information corresponding to the best match to output device 108.
5. Logic device 113 examines memory 102 to determine if a refresh of memory 101 needs to be performed, and performs it if necessary.

When a write operation occurs, the following operations occur:
1. Logic device 116 examines memory 103 to determine if there is space to perform the write operation, and aborts the operation if there is not.
2. Data to be written is received by logic device 114 and temporarily stored in memory 103.
3. Logic device 114 reads memory 102 to determine which row to insert the data into.
4. Logic device 114 reads the row 205 of memory 101 corresponding to the data to be inserted, and inserts the data from memory 103, erasing it from memory 103 at the same time. If duplicated content words 203 are present in support of the longest-match function. logic device 114 examines the row 205 to determine whether they are still necessary, and deletes the duplicated content words 203 if they are no longer needed. If data is displaced by the insertion, it is placed in memory 103. If data is displaced by the insertion, additional data may also be moved to memory 103 in support of shortened match words 202. If data is displaced by the insertion, longer-match words in the row 205 may need to be duplicated and placed in the next row 205.
5. Logic device 114 computes the maximum of the match portions of the content words 203 in the row 205 and writes the corresponding value 202 in memory 102.
6. Logic device 114 repeats steps 4 and 5 on the next row, into which the displaced data will be inserted, updating the longer-match words from the previous rows if they are necessary, until memory 103 is empty, inserting data into new rows 205 if necessary.

Deletions are handled in the same way, except that no data will be displaced and so repeating is not necessary. Multiple write operations can be handled at once for the purposes of steps 3 through 6, with the lowest value being used in step 3. Write operations have the side effect of refreshing the memory, and the functionality of logic devices 113 and 114 may be combined.

What is claimed is:

1. A content-addressable memory (CAM) comprising:
   (a) a first memory cell storage partitioned into a plurality of blocks, each block containing a plurality of content words each stored entirely within the block, each content word consisting of a match portion and optionally a result portion, and the content words arranged in the blocks according to the values of their match portions;
   (b) a second memory cell storage containing values forming maxima for each block and minima for each next block, such that no content word stored in a block is greater than the value stored in the location in the second memory corresponding to that block nor smaller than the value stored in the location in the second memory corresponding to the next block;
   (c) an input interface receiving candidate values to be compared to the stored values in the first memory
   (d) a first logic device capable of determining a closest match among all the values stored in any given block in the first memory;
   (e) a second logic device capable of determining a closest match among all the values stored in the second memory;
   (f) a mechanism for selecting a block of the first memory based on the results of the second logic device, and reading the contents of the selected block into the first logic device; and
   (g) an output interface transmitting matched result values from the matched stored values in the first memory.

2. The CAM in claim 1, wherein the first logic device performs a longest match, and wherein the values stored in the first memory are arranged such that if a value is stored in a particular block, all other values which the value would match are also stored in the block, replicating those values if necessary, but not including those values in the calculation of minima and maxima in the second memory if they are duplicates, so that only one block need be examined to determine the longest match.

3. The CAM in claim 1, wherein the second memory stores values whose length is less than that of the content words in the first memory, and in which the content words in the first memory are stored such that appropriate minima and maxima may be formed by extending the values stored in the second memory to the width of the content words.

4. The CAM in claim 1, wherein the first memory is a dynamic memory.

5. The CAM in claim 4, additionally comprising a third logic device which automatically refreshes the dynamic memory.

6. The CAM in claim 5, wherein the third logic device also examines the second memory to determine whether any content words are stored in each row of the first memory, and refreshes only those rows containing content words.

7. The CAM in claim 1, additionally comprising a fourth logic device which inserts additional content words in the first memory, moving existing content words to new blocks of the first memory if necessary, and which updates the values stored in the second memory, such that the values stored in the second memory comprise minima and maxima as before.

8. The CAM in claim 2, additionally comprising a fourth logic device which inserts additional content words in the first memory, moving existing content words to new blocks of the first memory if necessary, including longer-match content words in those blocks if necessary, and which updates the values stored in the second memory, such that the values stored in the second memory comprise minima and maxima as before.

9. The CAM in claim 3, additionally comprising a fourth logic device which inserts additional content words in the first memory, moving existing content words to new blocks of the first memory if necessary, and which updates the values stored in the second memory, such that the values stored in the second memory, when extended as described in claim 2, comprise minima and maxima as before.

10. The CAM in claim 7, additionally comprising:
    (a) a third memory cell storage containing content words which the fourth logic device is in the process of inserting into the first memory; and
    (b) a fifth logic device capable of determining a closest match among the output of the first logic device and all the content words stored in the third memory.

11. The CAM in claim 10, wherein the third memory also stores content words from the first memory while the fourth logic device is in the process of relocating those content words.

12. The CAM in claim 10, additionally comprising a sixth logic device which monitors the number of content words stored in the third memory and prevents additional words from being inserted into the CAM if the third memory is full.

13. The CAM in claim 11, wherein the first memory is a dynamic memory, and wherein the fourth logic device also automatically refreshes the dynamic memory.

14. The CAM in claim 12, wherein the first memory is a dynamic memory, and wherein the fourth logic device also automatically refreshes the dynamic memory.

15. The CAM in claim 14, wherein the sixth logic device prevents the third memory from being overfilled solely by limiting the rate at which writes may be performed.

\* \* \* \* \*